US012791587B2

(12) United States Patent
Porter et al.

(10) Patent No.: US 12,791,587 B2

(45) Date of Patent: Nov. 10, 2026

(54) ACTUATOR POSITION INDICATOR USING ACTUATOR INDUCTANCE

(71) Applicant: S&C Electric Company, Chicago, IL (US)

(72) Inventors: David G. Porter, East Troy, WI (US); Thomas J. Dyer, Minneola, FL (US); Joseph W. Milton, Milwaukee, WI (US); Andrew B. Berman, Racine, WI (US); Christine E. McNeil, West Allis, WI (US)

(73) Assignee: S&C Electric Company, Chicago, IL (US)

( * ) Notice: Subject to any disclaimer, the term of this patent is extended or adjusted under 35 U.S.C. 154(b) by 119 days.

(21) Appl. No.: 18/483,127

(22) Filed: Oct. 9, 2023

(65) Prior Publication Data

US 2024/0118318 A1 Apr. 11, 2024

Related U.S. Application Data

(60) Provisional application No. 63/415,188, filed on Oct. 11, 2022.

(51) Int. Cl.

| | |
|---|---|
| ***G01R 15/18*** | (2006.01) |
| ***G01R 31/327*** | (2006.01) |
| ***H01H 47/00*** | (2006.01) |

(52) U.S. Cl.

CPC ....... *G01R 15/181* (2013.01); *G01R 31/3278* (2013.01); *H01H 47/002* (2013.01)

(58) Field of Classification Search

None

See application file for complete search history.

(56) References Cited

U.S. PATENT DOCUMENTS

| | | | | |
|---|---|---|---|---|
| 7,239,490 | B2 * | 7/2007 | Benke .................. | H01H 33/666 218/118 |
| 7,990,663 | B2 | 8/2011 | Ziegler et al. | |
| 9,620,316 | B2 * | 4/2017 | Gentsch ............... | H01H 1/5822 |
| 10,734,178 | B2 * | 8/2020 | Balbinot .............. | H01H 1/0015 |
| 12,217,922 | B2 * | 2/2025 | Bachorz ............. | G01R 31/3275 |
| 2011/0228438 | A1 * | 9/2011 | Kohri ................... | H01H 1/0015 361/187 |
| 2021/0134538 | A1 * | 5/2021 | Rusev .................. | H01H 33/666 |

FOREIGN PATENT DOCUMENTS

| | | | | |
|---|---|---|---|---|
| JP | 11-153247 | * | 8/1999 | ............. F16K 31/06 |
| JP | 11-153247 A | * | 8/1999 | ............. F16K 31/06 |

* cited by examiner

*Primary Examiner* — Richard Isla

(57) ABSTRACT

A system and method for determining an open or closed position of a magnetically actuated vacuum interrupter. The method includes applying a voltage signal of a known voltage to the actuator over a predetermined period and determining a change in current over time during the period when the voltage signal is applied to the actuator using an output of a Rogowski coil. The method also includes calculating the inductance using the voltage and the change in current over time at a predetermined time during the period and using the calculated inductance to determine whether the actuator and thus the vacuum interrupter are in the open or closed position.

17 Claims, 4 Drawing Sheets

ACTUATOR POSITION INDICATOR USING ACTUATOR INDUCTANCE

CROSS-REFERENCE TO RELATED APPLICATION

This application claims the benefit of priority from the U.S. Provisional Application No. 63/415,188, filed on Oct. 11, 2022, the disclosure of which is hereby expressly incorporated herein by reference for all purposes.

BACKGROUND

Field

This disclosure relates generally to a system and method for determining an open and closed position of a magnetically actuated switch and, more particularly, to a system and method for determining an open and closed position of a magnetically actuated vacuum interrupter that includes calculating the inductance of the magnetic actuator.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be connected to high voltage transmission lines that deliver electrical power to a number of substations typically located within a community, where the voltage is stepped down to a medium voltage for distribution. The substations provide the medium voltage power to a number of three-phase feeders including three single-phase feeder lines that carry the same current, but are 120° apart in phase. A number of three-phase and single phase lateral lines are tapped off of the feeder that provide the medium voltage to various distribution transformers, where the voltage is stepped down to a low voltage and is provided to a number of loads, such as homes, businesses, etc.

Some power distribution networks may employ a number of underground single-phase lateral circuits that feed residential and commercial customers. Often times these circuits are configured in a loop and fed from power sources at both ends, where an open circuit location in the loop isolates the two power sources. Transformers are dispersed along the loop that each service a number of loads, where the open circuit location is typically provided at one of the transformers. A single-phase line is coupled to the primary coil in each transformer so that current flows to the primary coils along the loop. It has been proposed in the art to provide a switching device at the source side and the load side of each transformer between the primary coil and the line. The two switching devices in each transformer can be controlled by a common control unit that provides fault isolation and power restoration in response to a fault in the line.

These, and other types of switching devices, often employ a vacuum interrupter and a magnetic actuator to operate the vacuum interrupter. A vacuum interrupter is a switch that employs opposing contacts, one fixed and one movable, positioned within a vacuum enclosure. When the vacuum interrupter is opened by operating the magnetic actuator to move the movable contact away from the fixed contact to prevent current flow through the interrupter a plasma arc is created between the contacts that is contained and quickly extinguished by the vacuum at the next zero current crossing.

The magnetic actuator used in these types of switching devices typically have an armature or plunger that is moved by an electrical winding wound on a stator to open and close the vacuum interrupter contacts, where the plunger and the stator provide a magnetic path for the magnetic flux produced by the winding, and where the plunger is rigidly fixed to the movable contact by a drive rod. In one design, when the actuator is controlled to close the vacuum interrupter, the winding is energized by current flow in one direction, which causes the plunger to move and seat against a latching plate. The current is then turned off to de-energize the coil and permanent magnets hold the plunger against the latching plate and against a compression force of an opening spring. When the actuator is controlled to open the vacuum interrupter, the winding is energized by current flow in the opposite direction, which breaks the latching force of the permanent magnets and allows the opening spring to open the vacuum interrupter. A compliance spring is provided in addition to the opening spring to provide an additional opening force at the beginning of the opening process so as to break the weld on the interrupter contacts.

Typically in these types of switching devices, a position indicator, such as a switch or an optical position indicator, is employed to show the position of the actuator to indicate if the vacuum interrupter is open or closed. However, the indicator must be positioned in the actuator with reasonably high tolerance to reliably indicate the vacuum interrupter position. In addition, wiring between the actuator position indicator and the controls is necessary and often needs to go through a number of connectors. These various things add cost to the switching device and provide a number of failure areas that can cause reliability problems.

SUMMARY

The following discussion discloses and describes a system and method for determining an open and closed position of a magnetically actuated vacuum interrupter. The method includes applying a voltage signal of a known voltage to the actuator over a predetermined period and determining a change in current over time during the period when the voltage signal is applied to the actuator using an output of a Rogowski coil. The method also includes calculating the inductance using the voltage and the change in current over time at a predetermined time during the period and using the calculated inductance to determine whether the actuator and thus the vacuum interrupter are in the open or closed position.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a system and method for determining an open and closed position of a magnetically actuated vacuum interrupter that includes calculating the inductance of the magnetic actuator is merely exemplary in nature, and is in no way intended to limit the disclosure or its applications or uses. For example, the system and method have particular application for use in a switching device associated with transformers in a residential loop circuit. However, the system and method may have other applications.

Figure 1:
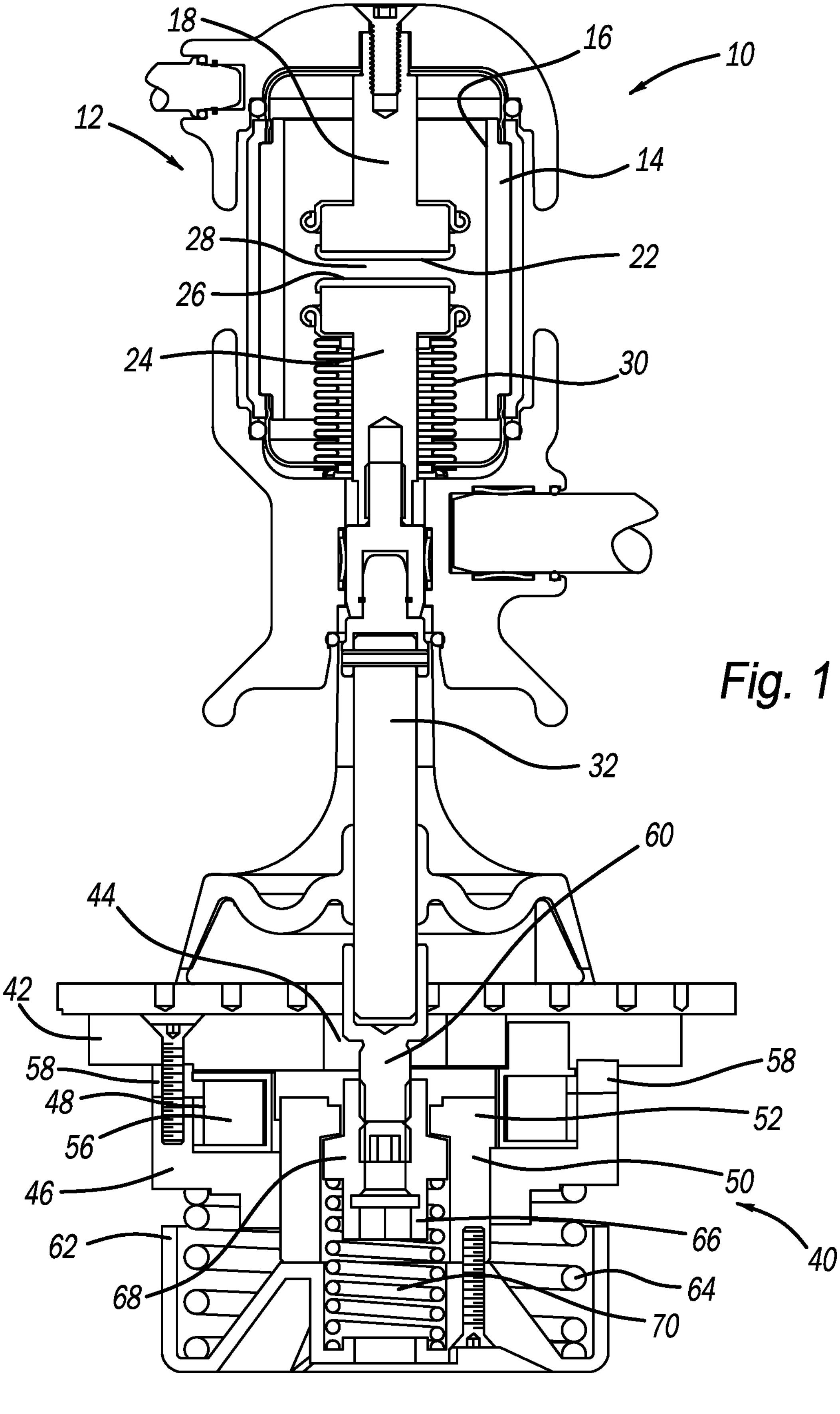
FIG. 1 is a cross-sectional type view of a switching device including vacuum interrupter and a magnetic actuator, where the vacuum interrupter and actuator are in the open position.

FIG. 1 is a cross-sectional type view of a switching device 10 intended to represent any switching device suitable for the purposes discussed herein. The switching device 10 includes a vacuum interrupter 12 having a vacuum enclosure 14 defining a vacuum chamber 16, an upper fixed terminal 18 extending through the enclosure 14 and into the chamber 16 and having a contact 22 and a lower movable terminal 24 extending through the enclosure 14 and into the chamber 16 and having a contact 26, where a gap 28 is provided between the contacts 22 and 26 when the vacuum interrupter 12 is open. A bellows 30 allows the movable terminal 24 to move without affecting the vacuum integrity of the chamber 16. The movable terminal 24 is coupled to a drive rod 32.

The switching device 10 also includes an actuator 40 that controls the drive rod 32 through a coupling rod 60 to open and close the vacuum interrupter 12. The actuator 40 includes an annular latching plate 42 having a central opening 44 through which the coupling rod 60 extends. The actuator 40 also includes a stator 46 defining a central opening 48, where a magnetic plunger 50 having a top shoulder 52 is slidably positioned within the opening 48. A coil 56 is positioned against the stator 46 in the opening 48 and a series of permanent magnets 58 are positioned between the plate 42 and the stator 46. A cup member 62 is rigidly secured to the plunger 50 and an opening spring 64 is provided within the cup member 62 and is positioned against the stator 46. A stop member 66 including an annular flange 68 is provided within the plunger 50 and is rigidly attached to the coupling rod 42 through the opening 44 in the plunger 50. A compliance spring 70 is provided within the cup member 62 and is positioned against the flange 68, which pushes the flange 68 against the shoulder 52.

Figure 2:
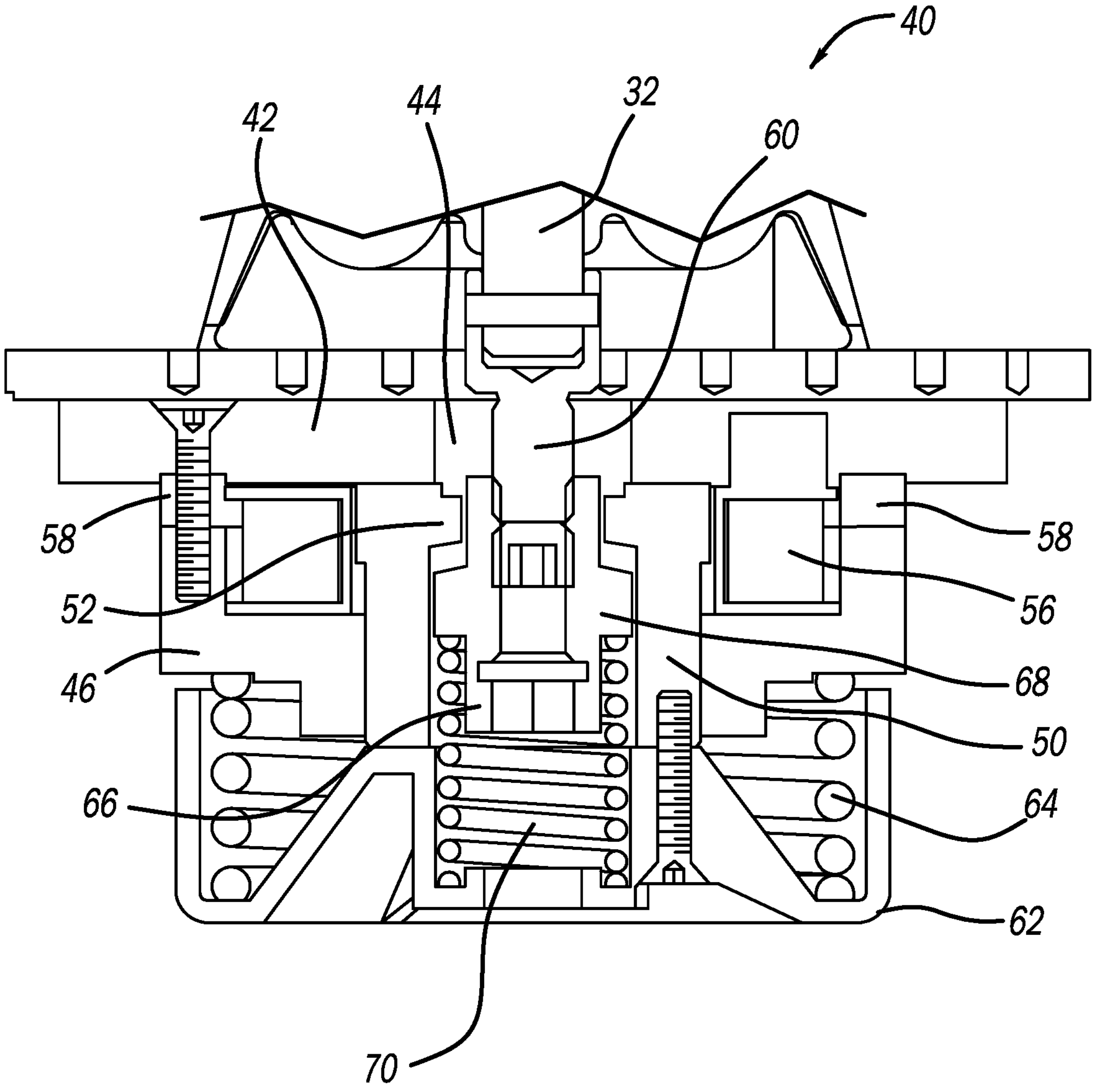
FIG. 2 is a cross-sectional type view of the magnetic actuator in the closed position and separated from the switching device.
Figure 3:
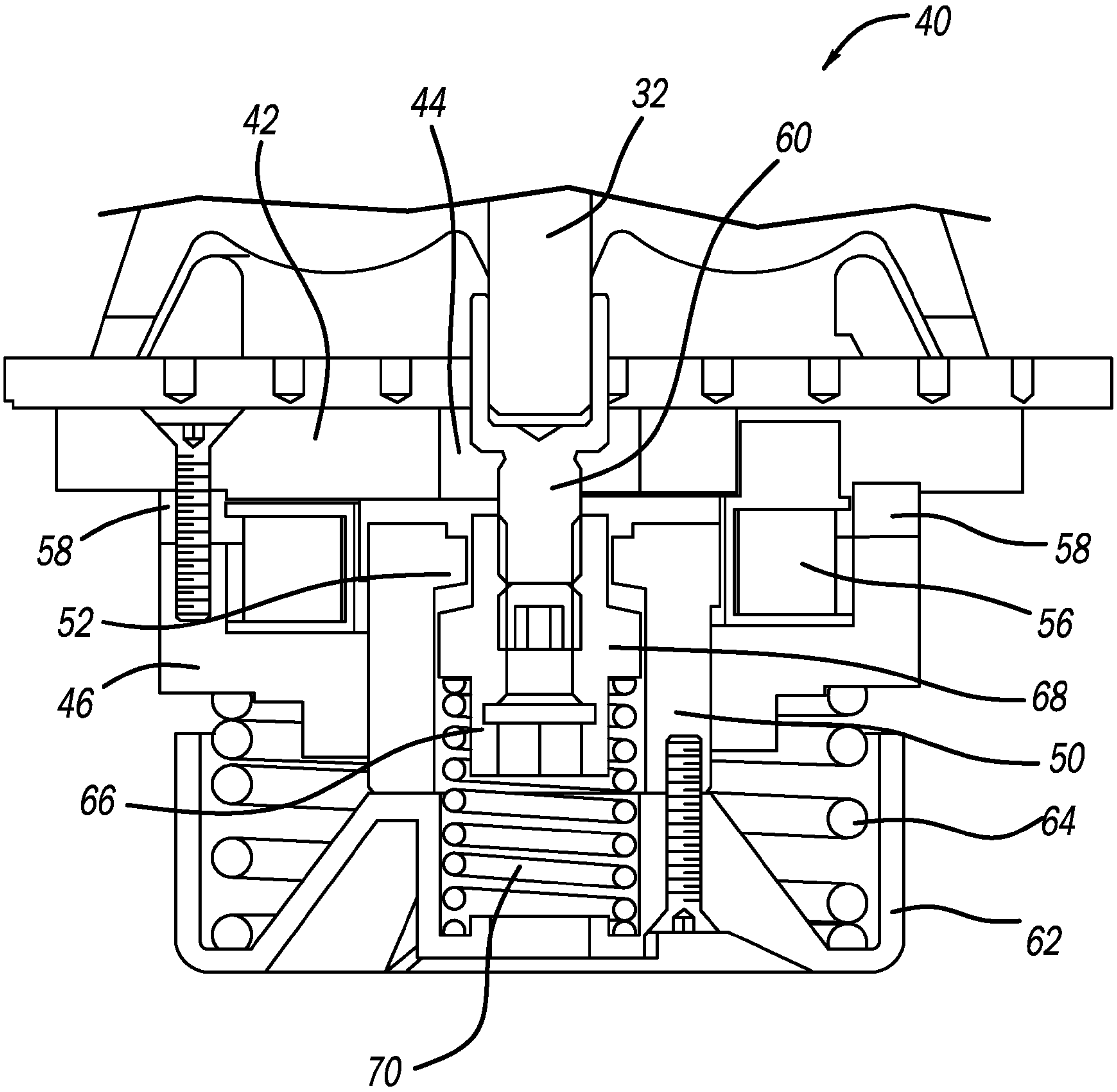
FIG. 3 is a cross-sectional type view of the magnetic actuator in a position between the open position and the fully closed position when the vacuum interrupter contacts first contact each other during a close operation and separated from the switching device.

The vacuum interrupter 12 and the actuator 40 are shown in the open position in FIG. 1. FIG. 2 is a cross-sectional type view of the actuator 40 in the closed position and FIG. 3 is a cross-sectional type view of the actuator 40 in the open position. When the vacuum interrupter 12 is to be closed, the coil 56 is energized with current flow in one direction, which draws the plunger 50 and the cup member 62 upward against the bias of the opening spring 64. When the contacts 22 and 26 touch the compliance spring 70 compresses, the cup member 62 continues to move and the flange 68 stops moving so that when the vacuum interrupter 12 is completely closed the compliance spring 70 is more compressed than it was when the contacts 22 and 26 first touched. When fully closed, the plunger 50 is seated against the latching plate 42. The current to the coil 56 is turned off, and the permanent magnets 58 hold the plunger 50 in the closed position. When the vacuum interrupter 12 is to be opened, the coil 56 is energized in the opposite direction, which breaks the magnetic hold of the permanent magnets 58. The opening spring 64 and the compliance spring 70 provide the force to open the contacts 22 and 26 and may be used to break the welding force on the contacts 22 and 26.

As will be discussed in detail below, this disclosure proposes that instead of using a switch or optical position sensor to indicate whether the actuator 40 is in the closed or open position, the inductance of the actuator 40 is calculated to determine the position of the actuator 40, which will be different for the open and closed positions. Both the open and closed position of the actuator 40 are stable and typically have a different magnetic path. Specifically, for the open position of the actuator 40 a large air gap is created in the magnetic path and for the closed position of the actuator 40 a small air gap is created in the magnetic path, which creates different inductances. Particularly, inductance L is a function of both the number of turns of the coil 56, and the magnetic path reluctance. When the magnetic path is different the inductance is different. It is known that $V=L\ di/dt$, and thus $L=V/(di/dt)$. To obtain di/dt, the change in current can be measured over a certain time period. An alternative technique is to use a Rogowski coil, which measures di/dt directly. By measuring the coil drive voltage V and di/dt the inductance L can be calculated. This needs to be done without causing enough force to move the position of the actuator 40 in either the open or closed direction.

Figure 4:
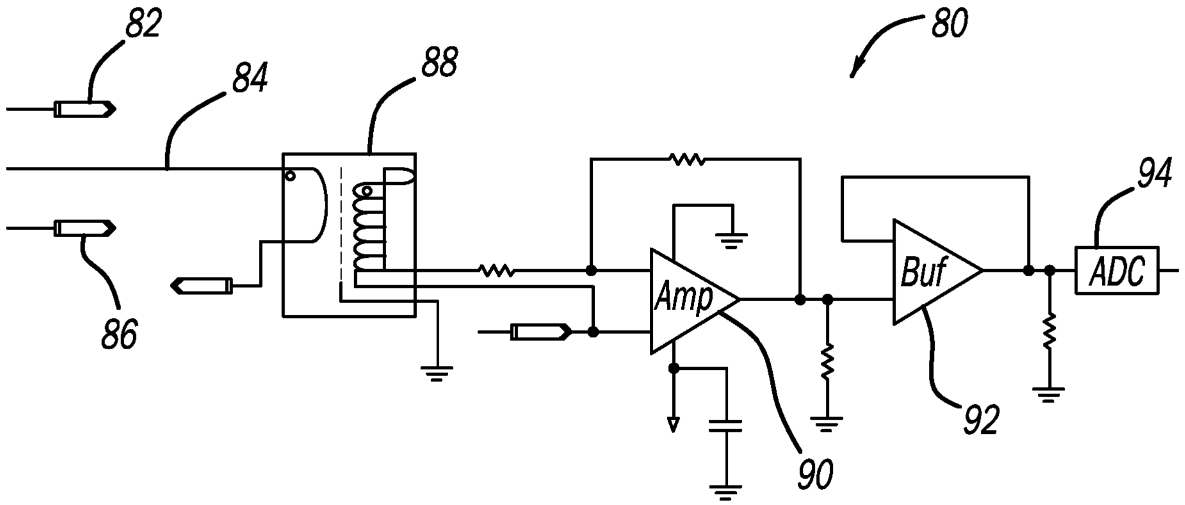
FIG. 4 is a schematic diagram of a measurement circuit for calculating inductance in a magnetically actuated switching device.

The Rogowski coil can be mounted directly to the control board (not shown) for the switching device 10 and additional circuitry and processing can be provided to calculate the inductance, as described. FIG. 4 is a schematic diagram of a measurement circuit 80 that has particular application for calculating the inductance in both of the actuators in the switching devices in the transformers in the underground single-phase lateral circuit referred to above, where a single control unit controls both of the switching devices. The circuit 80 receives the voltage output from a three-phase inverter (not shown) in the control unit, specifically a U-phase voltage on line 82, a V-phase voltage on line 84 and W-phase voltage on line 86. A test pulse is provided on two of the lines to determine the position of the actuator 40 for one of the switching devices. For example, to test the position of one of the actuators, a pulse from the inverter is provided on the U and V phase lines 82 and 84, and to test the position of the other actuator, a pulse from the inverter is provided on the V and W phase lines 84 and 86. This allows the V phase line 84 to be shared and measure the di/dt current in either actuator, however both actuators cannot be tested at the same time. The lines 82, 84 and 86 are connected to a Rogowski coil 88, which outputs 556 μV of current per amp of 60 Hz current. The di/dt output of the Rogowski coil 88 is amplified by an amplifier 90 and the output of the amplifier 90 is buffered by a buffer 92 and sent to an analog to digital converter (ADC) 94 to be converted to a digital signal.

Figure 5:
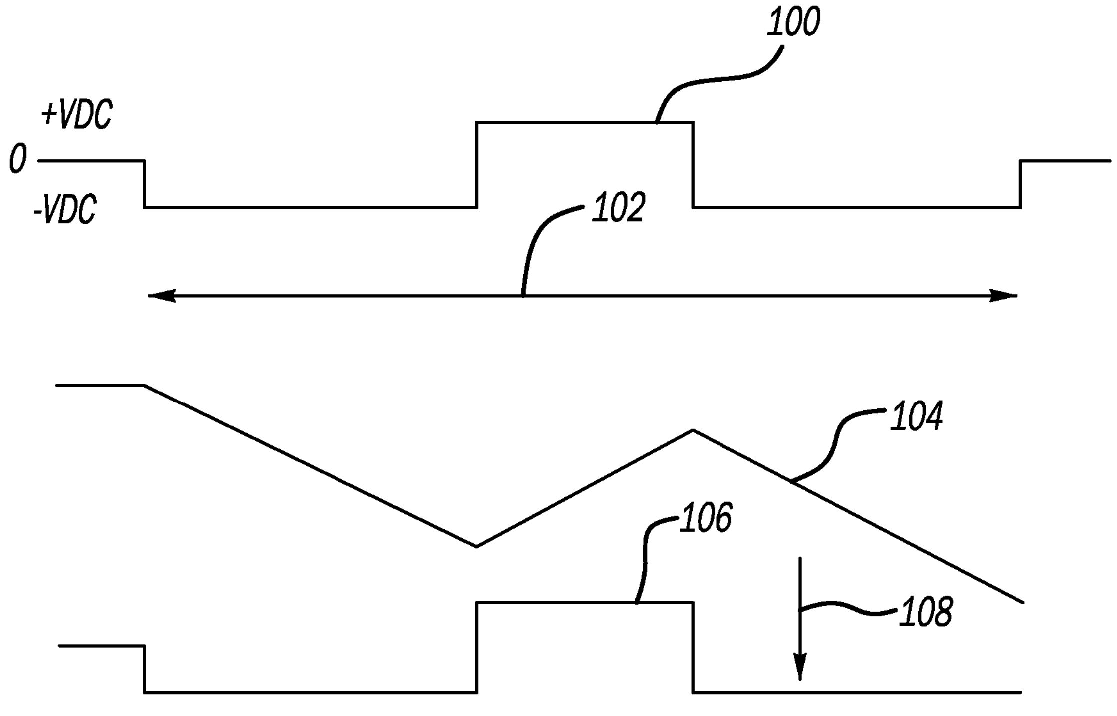
FIG. 5 shows a number of graph lines of the signals used in the measurement circuit shown in FIG. 4.

FIG. 5 shows a number of graph lines of the signals being described, where time is on the horizontal axis. Particularly, line 100, which starts at 0V, gives the coil voltage, where the absolute value of the positive and negative voltage is the voltage used for the inductance calculation. Line 102 is the test period, line 104 is the current that results from the test pulse and line 106 is the measured di/dt output from the ADC 94. For this non-limiting example, the test pulse is a pulse width modulation (PWM) signal having a duty cycle of 25% with a period of 1.04 ms, which is much less than the open or close time required to move the actuator 40 so that the actuator 40 doesn't move the vacuum interrupter 12. This means that the first 37.5% of the duty cycle is a negative voltage, followed by a positive voltage for 25% of the period, and then a negative voltage applied for the last 37.5% of the period. At 75% of the test period, the di/dt value is read at the output of the ADC 94 at line 108.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for determining a position of a magnetic actuator, the method comprising:

applying, by driver circuitry comprising a three-phase inverter, a diagnostic pulse-width-modulated (PWM) voltage signal of a known voltage to a coil of the actuator over a predetermined period, the diagnostic PWM voltage signal being selected in amplitude and duty cycle so as not to generate sufficient force to move the actuator;

determining, during the predetermined period, a change in current over time through the coil;

calculating, by a controller, an inductance value at a sampling time within the period corresponding to about 75% of the period using the applied voltage and the determined current over time according to L=V/(di/dt); and determining, by the controller, whether the actuator is in an open or closed position by comparing the calculated inductance value to stored position-specific threshold data established during a non-actuating calibration procedure when the actuator's open and closed positions were known, wherein the stored threshold data comprises at least one of: (i) an inductance range for the open position and an inductance range for the closed position; or (ii) a lookup table that maps inductance values to position states.

2. The method according to claim 1 wherein applying a voltage signal includes applying a voltage signal for the predetermined period that is too short to cause the actuator to actuate.

3. The method according to claim 1 wherein applying a voltage signal includes applying a pulse width modulation (PWM) signal having a duty cycle of 25%, and wherein the period is 1.04 ms.

4. The method according to claim 1 wherein determining a change in current over time includes measuring the current over time.

5. The method according to claim 1 wherein determining a change in current over time includes using an output of a Rogowski coil.

6. The method according to claim 1 wherein the magnetic actuator is part of a switching device including a switch, the magnetic actuator opening and closing the switch.

7. The method according to claim 6 wherein the switch is a vacuum interrupter.

8. The method according to claim 6 wherein the switching device is associated with a transformer in an electrical circuit.

9. The method according to claim 6 wherein the position of the actuator provides an indication of whether the switch is open or closed.

10. The method of claim 1, wherein the magnetic actuator is coupled to a vacuum interrupter and the determining step further comprises determining the vacuum interrupter state (open or closed) based on the determined actuator position using stored position-specific threshold data established during a non-actuating calibration procedure.

11. The method according to claim 10 wherein applying a voltage signal includes applying a voltage signal for the predetermined period that is too short to cause the actuator to actuate.

12. The method according to claim 10 wherein applying a voltage signal includes applying a pulse width modulation (PWM) signal having a duty cycle of 25%, and wherein the period is 1.04 ms.

13. The method according to claim 10 wherein the vacuum interrupter is associated with a transformer in an electrical circuit.

14. The method of claim 1, wherein establishing the stored position-specific threshold data comprises performing a non-actuating calibration at commissioning when the actuator's state is confirmed by a mechanical indicator.

15. A system for determining a position of a magnetic actuator, comprising:

driver circuitry comprising a three-phase inverter configured to apply to an actuator coil a diagnostic PWM voltage signal of known amplitude and period over a predetermined period, the diagnostic PWM voltage signal being selected not to move the actuator;

a current sensing circuit comprising a Rogowski coil proximate the actuator coil and signal-conditioning circuitry that provides a measurement indicative of di/dt during the predetermined period;

a controller comprising a processor and non-transitory memory storing instructions that, when executed, cause the processor to: (i) compute an inductance value at a sampling time corresponding to about 75% of the predetermined period using an applied voltage value and the measured di/dt according to L=V/(di/dt); and (ii) determine whether the actuator is in an open or a closed position by comparing the computed inductance value to stored, position-specific threshold data established during a non-actuating calibration procedure when the actuator's positions were known.

16. The system of claim 15, wherein the threshold data include a first inductance range corresponding to the actuator in the open position and a second inductance range corresponding to the actuator in the closed position, the ranges being recorded during a factory calibration with the actuator mechanically constrained in each position.

17. The system of claim 15, wherein the controller is further configured during commissioning to verify the threshold data by applying the diagnostic PWM voltage signal while a position sensor or mechanical indicator confirms the actuator position, and to store updated thresholds based on the measurements.

* * * * *